US010662522B1

(12) United States Patent
Amano

(10) Patent No.: US 10,662,522 B1
(45) Date of Patent: May 26, 2020

(54) THERMAL METAL CHEMICAL VAPOR DEPOSITION PROCESS

(71) Applicant: SANDISK TECHNOLOGIES LLC, Addison, TX (US)

(72) Inventor: Fumitaka Amano, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 56 days.

(21) Appl. No.: 16/184,038

(22) Filed: Nov. 8, 2018

(51) Int. Cl.
| | |
|---|---|
| C23C 16/06 | (2006.01) |
| C23C 16/04 | (2006.01) |
| C23C 16/507 | (2006.01) |
| C23C 16/08 | (2006.01) |

(52) U.S. Cl.
CPC .......... C23C 16/045 (2013.01); C23C 16/047 (2013.01); C23C 16/08 (2013.01); C23C 16/507 (2013.01)

(58) Field of Classification Search
CPC ..... C23C 16/045; C23C 16/047; C23C 16/08; C23C 16/507; C23C 16/06; C23C 16/50
See application file for complete search history.

(56) References Cited

U.S. PATENT DOCUMENTS

| | | | | |
|---|---|---|---|---|
| 5,298,295 A | * | 3/1994 | Winter | .................. C23C 16/305 427/248.1 |
| 6,204,170 B1 | * | 3/2001 | Taguwa | ............ H01L 21/28518 257/E21.165 |
| 9,748,174 B1 | | 8/2017 | Amano | |
| 2006/0260547 A1 | * | 11/2006 | Zultzke | .................. C23C 14/22 118/726 |
| 2008/0242065 A1 | * | 10/2008 | Brcka | ............... H01J 37/32623 438/513 |
| 2008/0308911 A1 | * | 12/2008 | Okamoto | ............ H01L 29/4908 257/623 |
| 2011/0065287 A1 | * | 3/2011 | Wajda | ............... H01L 21/02148 438/785 |

(Continued)

OTHER PUBLICATIONS

Birnie, Dunbar P., III, et al., "Film/substrate/vacuum-chuck interactions during spin-coating". Optical Engineering, vol. 31 No. 9, Sep. 1992, pp. 2012-2020.*

(Continued)

*Primary Examiner* — Bret P Chen
(74) *Attorney, Agent, or Firm* — The Marbury Law Group, PLLC

(57) ABSTRACT

A method of forming a metallic material on a substrate includes coating a chuck of a metallic material deposition chamber with an elemental metal coating, loading a substrate onto the chuck of the metallic material deposition chamber, and depositing an elemental metal layer on the substrate by thermal decomposition of a metal precursor gas including metal compound molecules. Each of the metal compound molecules includes an atom of the elemental metal and a first number of atoms of a non-metallic element. The metal compound molecules react with atoms of the elemental metal in the metal coating to generate molecules of an intermediate reaction compound including an atom of the elemental metal and a second number of atoms of the non-metallic element, the second number of atoms being less than the first number of atoms. The metal layer on the substrate is formed by thermal decomposition of the intermediate reaction compound.

20 Claims, 11 Drawing Sheets

(56) References Cited

U.S. PATENT DOCUMENTS

| | | | |
|---|---|---|---|
| 2011/0256419 A1* | 10/2011 | Iwayama | H01L 23/3733 428/627 |
| 2012/0003388 A1* | 1/2012 | Tzu | C23C 16/4412 427/250 |
| 2012/0100292 A1* | 4/2012 | Park | C23C 16/45508 427/255.28 |
| 2017/0373079 A1 | 12/2017 | Sharangpani et al. | |
| 2018/0090373 A1 | 3/2018 | Sharangpani et al. | |
| 2018/0247954 A1 | 8/2018 | Amano et al. | |

OTHER PUBLICATIONS

Kroninger, F., et al., "Application of advanced contamination analysis for qualification of wafer handling systems and chucks". Applied Surface Science, vol. 63, Issues 1-4, Jan. 1993, pp. 93-98. Abstract Only.*

U.S. Appl. No. 15/593,916, filed May 12, 2017, SanDisk Technologies LLC.

U.S. Appl. No. 16/184,059, filed Nov. 8, 2018, SanDisk Technologies LLC.

\* cited by examiner

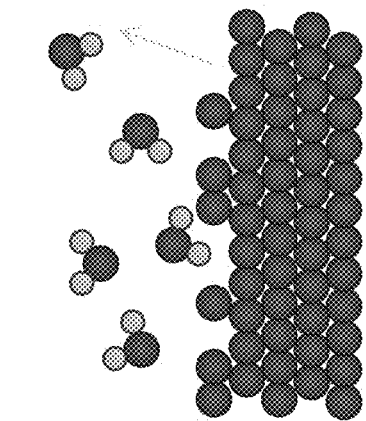
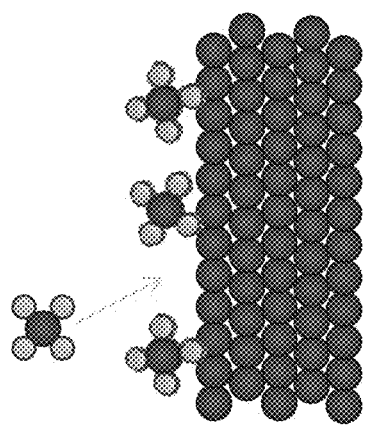
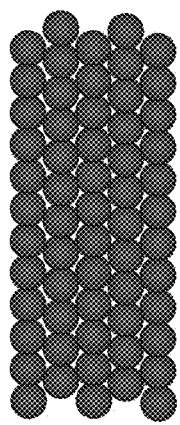
FIG. 1A
FIG. 1B

THERMAL METAL CHEMICAL VAPOR DEPOSITION PROCESS

FIELD

The present disclosure relates generally to semiconductor device manufacturing apparatuses, and particularly to thermal metal chemical vapor deposition tools and methods of using the same.

BACKGROUND

Conventional titanium deposition process uses plasma-enhanced chemical vapor deposition in which titanium tetrachloride ($TiCl_4$) is sequentially decomposed into titanium chloride compounds including a lesser number of chlorine atoms per titanium atom. The sequential decomposition processes for titanium tetrachloride include:

$$TiCl_4 + Ar^*(\text{activated argon atom}) \rightarrow TiCl_4^*(\text{activated } TiCl_4) + Ar; \quad (1)$$

$$TiCl_4^* + H^+ \rightarrow TiCl_3^*(\text{activated } TiCl_3) + HCl^+; \quad (2)$$

$$TiCl_3^* + TiCl_3^* \rightarrow TiCl_2 + TiCl_4; \text{ and} \quad (3)$$

$$TiCl_2 + H_2 \rightarrow Ti + 2HCl. \quad (4)$$

SUMMARY

According to an aspect of the present disclosure, a deposition apparatus comprises a deposition chamber comprising a chuck and a vacuum enclosure enclosing the chuck and connected to a vacuum pump system, and a gas manifold configured to provide process gases to the vacuum enclosure, the process gases including a metal precursor gas. The gas manifold comprises an in-line intermediate reaction compound generator including an inlet orifice into which the metal precursor gas is supplied and an exhaust orifice from which an intermediate reaction compound derived from the metal precursor gas exits into a gas inlet of the vacuum enclosure, and at least one metal portion connected to a heater configured to maintain the at least one metal portion at a temperature greater than 300 degrees Celsius during operation.

According to another aspect of the present disclosure, a deposition apparatus comprises a vacuum enclosure, a chuck positioned within the vacuum enclosure, a heater configured to heat the chuck to a process temperature greater than 300 degrees Celsius during operation, a vacuum pump system coupled to the vacuum enclosure, a gas manifold configured to provide process gases to the vacuum enclosure, the process gases including a metal precursor gas, and a showerhead within the vacuum enclosure configured to distribute the metal precursor gas over the chuck. The deposition apparatus is configured to perform the operations of depositing an elemental metal on the chuck during a first operation before a substrate is positioned on the chuck, and depositing a metal layer on the substrate during a second operation via chemical vapor deposition by heating the chuck to the process temperature while the metal precursor gas is flowed over the substrate and the chuck.

Another embodiment provides a deposition apparatus comprising a vacuum enclosure, a chuck positioned within the vacuum enclosure, a vacuum pump system coupled to the vacuum enclosure, and a means for depositing an elemental metal on the chuck during a first operation before a substrate is positioned on the chuck, and for depositing a metal layer on the substrate during a second operation via chemical vapor deposition by heating the chuck to the process temperature while a metal precursor gas is flowed over the substrate and the chuck. In one embodiment, the means for depositing may comprise one or more of the heater, the showerhead and/or the gas manifold.

According to another aspect of the present disclosure, a method of forming a metallic material on a substrate is provided. The method comprises: coating a chuck of a metallic material deposition chamber with a metal coating consisting essentially of an elemental metal, loading a substrate onto the chuck of the metallic material deposition chamber, depositing a metal layer consisting essentially of the elemental metal on the substrate by thermal decomposition of a metal precursor gas including metal compound molecules. Each of the metal compound molecules comprises an atom of the elemental metal and a first number of atoms of a non-metallic element. The metal compound molecules react with atoms of the elemental metal in the metal coating to generate molecules of an intermediate reaction compound including an atom of the elemental metal and a second number of atoms of the non-metallic element, the second number of atoms being less than the first number of atoms. The metal layer on the substrate is formed by thermal decomposition of the intermediate reaction compound.

BRIEF DESCRIPTION OF THE DRAWINGS

FIG. 1A illustrates a titanium material portion that is used to induce thermal decomposition of adsorbed titanium tetrachloride molecules into titanium dichloride molecules surface during a thermal titanium deposition process according to an embodiment of the present disclosure.

FIG. 1B illustrates a thermal decomposition process of a titanium dichloride molecule into titanium atom that occurs at a deposition surface during the thermal titanium deposition process according to an embodiment of the present disclosure.

DETAILED DESCRIPTION

Figure 2:
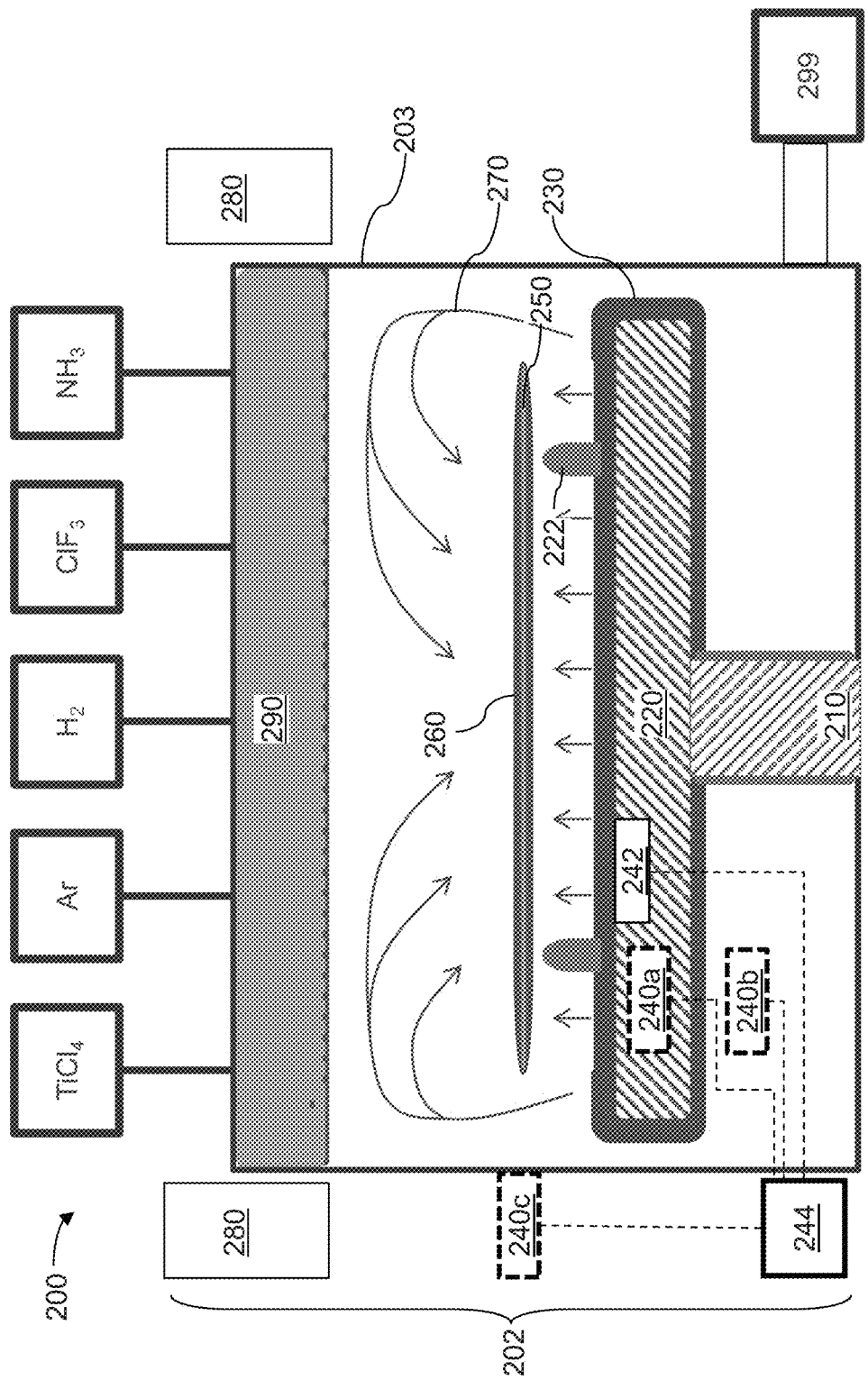
FIG. 2 is a vertical cross-sectional view of a first exemplary thermal chemical vapor deposition tool according to an embodiment of the present disclosure.

As discussed above, the present disclosure is directed to thermal titanium chemical vapor deposition tools, the various aspects of which are described below. Conventionally, energy for each step of the titanium decomposition process is provided predominantly by the plasma applied to a mixture of titanium tetrachloride and decomposition byproducts therefrom. Deposition of titanium in the plasma-enhanced chemical vapor deposition is directional, i.e., non-conformal. As such, coverage of titanium at a bottom of a high aspect ratio structure is poor, and the rate of titanium deposition in undercut regions and any region shadowed by an overlying structure is zero or very low. Various embodiments of the present disclosure provide a titanium deposition process that eliminates or alleviates the problems of a plasma-enhanced chemical vapor deposition process for titanium deposition.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure.

FIGS. 1A and 1B illustrate a deposition mechanism used according to an embodiment of the present disclosure. In this embodiment, a source metal plate including the elemental metal to be deposited on a substrate is provided in the path of a source gas including a gaseous compound of the elemental metal as illustrated in FIG. 1A. The source metal plate can be heated to an elevated temperature to facilitate decomposition of the gaseous compound of the elemental metal into an intermediate gaseous compound including a lesser number of a non-metallic element. The general reaction has the formula of $MQ_n+M \rightarrow MQ_{n-x}+MQ_x$, in which M represents a metallic element, Q represents a non-metallic element, and n is a number greater than 1, and x is a number equal to or greater than 1 and is less than n. In one embodiment, the metal M can be a transition metal. For example, the gaseous compound of the elemental metal may be a metal halide including more than two halogen atoms, and the intermediate gaseous compound may be another metal hydride including a lesser number of halogen atoms. Alternatively, the gaseous compound of the elemental metal may be a metal hydride including more than two hydrogen atoms, and the intermediate gaseous compound may be another metal hydride including a lesser number of hydrogen atoms.

In an exemplary embodiment, the metallic element is titanium, and the gaseous compound of the elemental metal provided as the source is titanium tetrachloride, and the intermediate gaseous compound is titanium dichloride. In this embodiment, the source gas of titanium tetrachloride can react titanium atoms of the surface of the titanium metal plate to generate titanium dichloride molecules as the intermediate gaseous compound. In this embodiment, the general reaction has the formula of $TiCl_4+Ti \rightarrow 2TiCl_2$, Referring to FIG. 1B, the intermediate gaseous compound can flow from the source metal plate further downstream into a deposition chamber, and can react in a process chamber to deposit the elemental metal on a physically exposed surface of a substrate that is located into the deposition chamber. The deposition process may be a thermal deposition process or plasma deposition process. An oxidation agent or a reduction agent may be flowed concurrently or alternatively with the flow of the intermediate gaseous compound into the deposition chamber to facilitate the reaction of the intermediate gaseous compound. If the intermediate gaseous compound is a metal halide gas, a reduction agent such as hydrogen can be flowed into the deposition chamber to facilitate deposition of the elemental metal.

In an exemplary embodiment, the metallic element can be titanium, and the intermediate gaseous compound provided into the deposition chamber can be titanium dichloride, and the deposition of titanium can be a reduction process. In this embodiment, the titanium dichloride molecules can be reduced into titanium atoms by the following reaction: $TiCl_2+H_2 \rightarrow Ti+2HCl$. The reduction process may occur in the gas phase or on the growth surface of a titanium layer.

According to an embodiment of the present disclosure, a two-step decomposition process of titanium tetrachloride can be used to deposit titanium with titanium dichloride as an intermediate reaction compound. The two-step decomposition process involves a lesser number of reactions and uses only titanium tetrachloride gas and hydrogen gas compared to a conventional four-step decomposition process that uses titanium tetrachloride gas, argon gas, and hydrogen gas and plasma that is necessary to generate $Ar^*$ and $H^+$. The two-step decomposition process does not require use of plasma, although plasma may be used to facilitate the deposition process. Further, because the two-step deposition process uses only two types of gases, process control is easier for the two-step deposition process of various embodiments compared to a conventional four-step decomposition process.

Referring to FIG. 2, a first exemplary chemical vapor deposition (CVD) tool 200 according to an embodiment of the present disclosure is illustrated. The first exemplary CVD tool 200 includes a metallic material deposition chamber 202. The metallic material deposition chamber 202 is configured for deposition of titanium therein, and includes a chamber enclosure 203, a chuck (or a susceptor) 220 configured to hold a substrate 250 with a set of pins 222, a chuck support 210 configured to physically support the chuck 220, and a showerhead 290 located over the chuck 220 and inside of the chamber enclosure 203.

A metal precursor gas source and any additional reaction gas (such as an oxidation agent or a reduction agent) can be connected to the showerhead 290 via suitable flow control mechanisms (such as mass flow controllers). In the illustrated example, the metal precursor gas is titanium tetrachloride and the additional process gas is hydrogen gas, which function as a reduction agent. Additional process gases may include a carrier gas (such as argon) and/or a purge gas (such as nitrogen (not shown)), which may be flowed during the deposition process and/or during, before, and/or after a substrate transfer. A nitridation process may be performed in the deposition chamber, for example, by nitriding a deposited metallic material. In this case, a nitridation agent gas such as $NH_3$ may be connected to the showerhead 290 through a suitable flow control mechanism (such as a mass flow controller). Further, etchant gases for cleaning the deposition chamber by etching a coated metallic material may be provided. Such etchant gases can include $ClF_3$ and/or $NF_3$. The showerhead 290 faces the front side of the substrate 250, and is configured to distribute the metal precursor gas and other process gases over the chuck 220 during formation of a metal coating 230 on the chuck 220 and during formation of a metal layer on the substrate 250.

The metallic material deposition chamber 202 can be provided with an energy source configured to activate the metal precursor gas and/or an intermediate reaction compound that is derived from the metal precursor gas. The energy source can be a deposition chamber heater 240a, 240b, 240c, which may be positioned near, on or within (e.g., 240a) the chuck 220, may be included within (e.g., 240b) or located on the chamber enclosure 203, and/or may be located outside the chamber enclosure 203 (e.g., 240c). In one embodiment, the deposition chamber heater may be located in (e.g., 240a), near or on the chuck 220, and may be configured to heat the chuck 220 to an elevated process temperature.

The deposition chamber heater 240a, 240b, 240c may be coupled to and controlled by a heater power control mechanism 344 that is coupled to at least one thermocouple 342 and configured to control deposition chamber heater to the maintain the temperature of the chuck 220 at a process temperature. The process temperature of the chuck 220 during a deposition step may be in a range from 300 degrees Celsius to 800 degrees Celsius, such as from 400 degrees Celsius to 750 degrees Celsius, although lesser and greater temperatures may also be used. Alternatively or additionally, a radio-frequency (RF) power source 280 can be provided to apply RF energy to the chuck 220 and substrate 250 within the metallic material deposition chamber 202. In this embodiment, a plasma can be generated to facilitate decomposition of the metal precursor source gas.

The set of pins 222 may be located on or configured as part of the chuck 220, and may be fixed or retractable. The total number of pins 222 may be at least three, such as three, four, five, six, or more in order to provide stable mechanical support to the substrate 250 upon loading.

The enclosure 203 may be provided with a movable sealing mechanism (such as a slit door equipped with a slit valve) in order to facilitate transfer of the substrate 250 into the metallic material deposition chamber 202. A substrate transfer mechanism (such as a robotic blade not shown) may be provided to transfer the substrate 250 into, and out of, the metallic material deposition chamber 202.

The chuck support 210 may be stationary, or may be configured to move vertically to facilitate transfer of the substrate 250. Optionally, the chuck support 210 may be configured to rotate the chuck 220 around a vertical axis, i.e., about an axis that is perpendicular to a top surface of the chuck 220 and passes through a geometrical center of the chuck 220.

The metallic material deposition chamber 202 can be provided with a vacuum pump system 299 and a pressure control mechanism. For example, at least one pressure gauge may be provided inside the chamber enclosure 203, and the output from the at least one pressure gauge can be transmitted to a pressure controller that controls the conductance of a tube connecting the volume inside the chamber enclosure 203 to the vacuum pump system 299. The vacuum pump system 299 includes at least one vacuum pump, such as a combination of a rotary pump and a turbo pump. The base pressure within the chamber enclosure 203 may be in a range from 0.001 mTorr to 0.1 mTorr. The process pressure during a deposition step may be in a range from 1 Torr to 10 Torr, such as from 4 Torr to 5 Torr, although lesser and greater process pressures can also be used.

During operation of the metallic material deposition chamber 202, a metal coating 230 can be formed on the surface of the chuck 220 prior to introduction of the substrate 250 into the metallic material deposition chamber 202. The metal precursor gas decomposes into the intermediate gaseous compound at the surface of the metal coating 230. The intermediate gaseous compound diffuses from the surfaces of the metal coating 230 upward toward the backside surface of the substrate 250 and toward the front surface of the substrate 250 along intermediate gaseous compound flow paths 270, which can be generally against the flow direction of the metal precursor gas out of the showerhead 290. Thus, the general flow direction of the metal precursor gas can be from the showerhead 290 toward the chuck 220, and the general flow direction of the intermediate gaseous compound formed by reaction of the metal precursor gas with the metal coating 230 on the chuck 220 can be from the chuck 220 toward the showerhead 290. The intermediate gaseous compound flow paths 270 include direct flow paths that originate from the surfaces of the metal coating 230 toward the backside surface of the substrate 250 and roundabout flow paths that originate from the surfaces of the metal coating 230 (such as the sidewall portions of the metal coating 230), go through a volume between the substrate 250 and the showerhead 290, and terminate on the top surface of the substrate 250. In this manner, a metal layer 260 can be formed on the entire physically exposed surface of the substrate 250 including on the front side surface of the substrate 250 and on the backside surface of the substrate 250.

Figure 3:
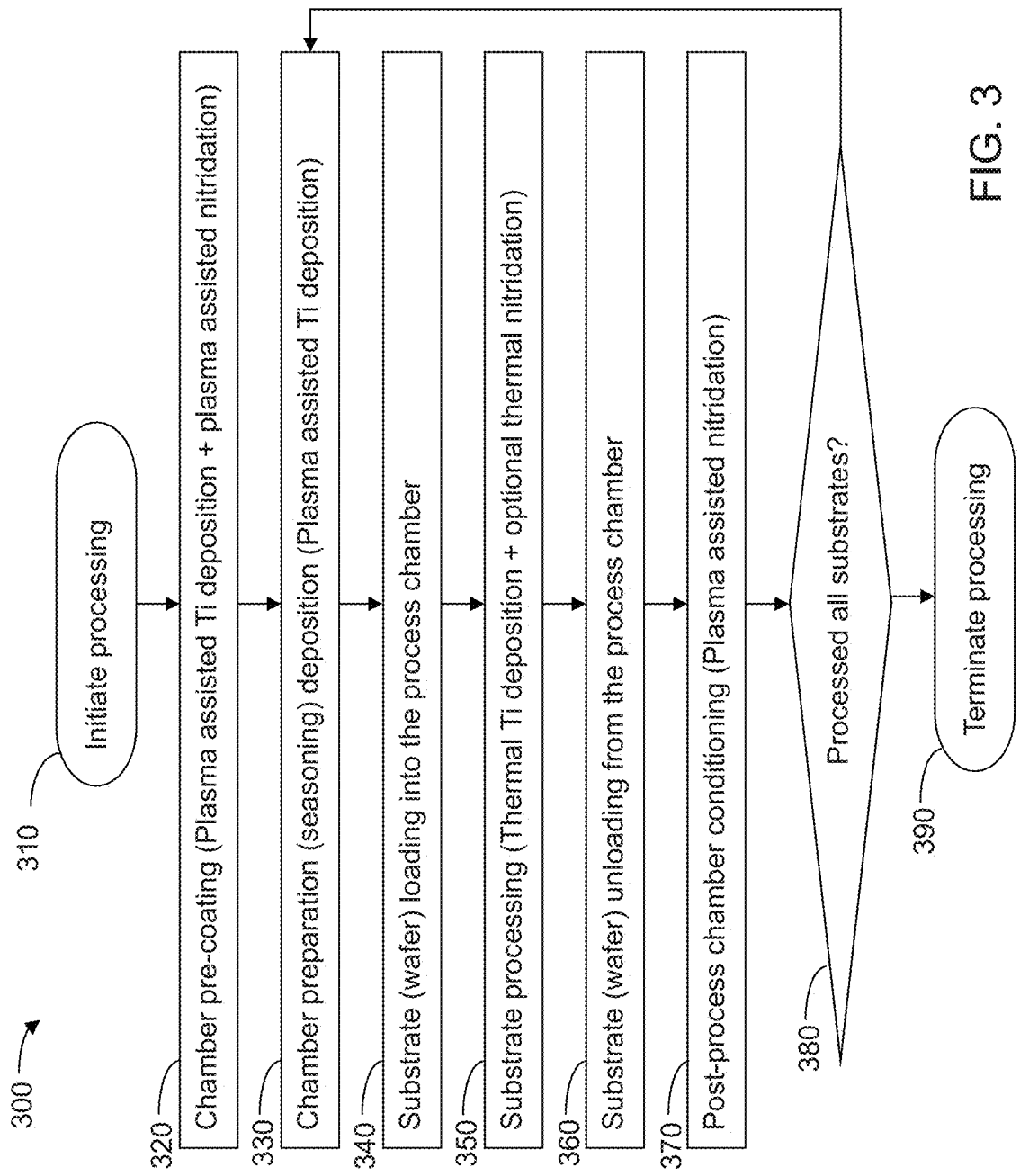
FIG. 3 is a flow chart for depositing a titanium film on a substrate using a thermal chemical vapor deposition tool according to an embodiment of the present disclosure.

FIG. 3 illustrates a sequence of processing steps of a method 300 that can be followed to deposit a metal layer 260 (such as a titanium film or a titanium nitride film) on a substrate 250 using the CVD tool 200 illustrated in FIG. 2.

Step 310 of initiating processing may include providing the CVD tool 200 of FIG. 2 and an unprocessed substrate 250 on which a metal layer 260 is to be subsequently deposited.

Referring to step 320, in case a metal nitride layer is to be formed on the substrate 250, a chamber pre-coating process that forms a metal nitride precoat layer on the chuck 220 can be performed. In this case, the chamber pre-coating process deposits a metal precoat layer using a plasma-assisted metal deposition process. In one embodiment, a plasma-assisted chemical vapor deposition process may be used to deposit the metal precoat layer. In this case, the RF power source 280 can be used to provide plasma energy while the metal precursor gas and any additional reaction gas is supplied into the metallic material deposition chamber. For example, titanium tetrachloride can be supplied as the metal precursor gas, and argon gas and hydrogen gas can be used as the additional reaction gases flowed into the metallic material deposition chamber before the substrate 250 is present. The RF power source 280 can provide RF energy to generate plasma conditions within the metallic material deposition chamber 202. The metal precoat layer can be formed on the chuck 220 and on the inner sidewalls of the chamber enclosure 203. The RF assisted metal deposition process is generally non-conformal. However, the lack of conformity in the RF assisted metal deposition is immaterial because deposition does not occur on the substrate 250, which is located outside the metallic material deposition chamber at this process step. In case a titanium nitride is to be formed in the chamber pre-coating process, a conventional plasma-assisted titanium deposition process can be performed within the metallic material deposition chamber using the reaction chemistry of:

$$TiCl_4 + Ar^*(\text{activated argon atom}) \rightarrow TiCl_4^*(\text{activated } TiCl_4) + Ar; \tag{1}$$

$$TiCl_4^* + H^+ \rightarrow TiCl_3^*(\text{activated } TiCl_3) + HCl^+; \tag{2}$$

$$TiCl_3^* + TiCl_3^* \rightarrow TiCl_2 + TiCl_4; \text{ and} \tag{3}$$

$$TiCl_2 + H_2 \rightarrow Ti + 2HCl. \tag{4}$$

Subsequently, the metal precoat layer (such as a titanium precoat layer) can be converted into a metal nitride precoat layer (such as a titanium nitride precoat layer) by a plasma-assisted nitridation process. In this case, ammonia ($NH_3$) can be flowed into the metallic material deposition chamber, and the RF power source 280 can provide RF power to the ammonia molecules to generate a plasma of ammonia, which can nitridate at least the surface portion of the metal precoat layer. The thickness of the metal precoat layer as deposited can be in a range from 100 nm to 1000 nm. All or a portion of the metal precoat layer may be converted into the metal nitride precoat layer. In case the metal precoat layer consists essentially of titanium, the metal nitride precoat layer can consist essentially of titanium nitride.

Referring to step 330, a chamber preparation deposition process (which is also referred to as a chamber seasoning deposition process) can be performed to deposit a metal coating 230 on the physically exposed surfaces of the chuck 220. The metal coating can consist essentially of an elemental metal. In one embodiment, the elemental metal can be a transition metal. In one embodiment, the transition metal can be titanium. The metal coating 230 does not need to be conformal, and thus, a plasma-assisted metal deposition process (PECVD) can be used. In the PECVD process, decomposition of the metal precursor gas is assisted by a plasma that is generated by application of external radio frequency power into the metallic material deposition chamber 202. In one embodiment, the metal coating 230 can have a thickness within a range from 50% of the thickness of a metal layer 260 to be subsequently deposited on the substrate 250 to 500% of the thickness of the metal layer 260 to be subsequently deposited on the substrate 250. In one embodiment, the metal coating 230 can have a thickness within a range from 100% of the thickness of a metal layer 260 to be subsequently deposited on the substrate 250 to 250% of the thickness of the metal layer 260 to be subsequently deposited on the substrate 250.

Referring to step 340, the substrate 250 can be moved into the metallic material deposition chamber 202 and positioned on the chuck 220. For example, a robotic blade can carry the substrate 250 from outside the metallic material deposition chamber 202 into the metallic material deposition chamber 202 through a slit valve located within a load region of the chamber enclosure 203. The robotic blade can place the substrate 250 on the set of pins 222 over the chuck 250. Upon unloading the substrate 250, the robotic blade can exit the metallic material deposition chamber 202, and the metallic material deposition chamber 202 can be sealed by closing the slit valve.

Referring to step 350, a metal layer 260 consisting essentially of the elemental metal contained in the metal precursor gas is deposited on the substrate 250 by a thermal chemical vapor deposition (CVD) process. The metal precursor gas includes metal compound molecules in a gas phase. The thermal CVD process uses thermal decomposition of the metal precursor gas mediated by the metal coating 230 on the chuck 220.

In one embodiment, each of the metal compound molecules can include an atom of an elemental metal and a first number of atoms of a non-metallic element. In one embodiment, the elemental metal can be an elemental transition metal. The elemental metal in the metal compound molecules of the metal precursor gas is the same as the element metal in the metal coating 230. The first number of atoms is greater than 1, and can be in a range from 2-6. In one embodiment, the non-metallic element can include a halogen element. In one embodiment, the first number can be four, and the non-metallic element can be a halide atom. In this case, the metal compound molecules can comprise molecules of a transition metal tetrachloride. In one embodiment, the transition metal tetrachloride can include titanium tetrachloride.

The metal compound molecules of the metal precursor gas diffuse to the surfaces of the metal coating 230 and react with atoms of the elemental metal in the metal coating 230. Molecules of an intermediate reaction compound including an atom of the elemental metal and a second number of atoms of the non-metallic element are generated by the reaction of the metal compound molecules of the metal precursor gas and the elemental metal of the metal coating 230. The second number of atoms is less than the first number of atoms. In one embodiment, the second number can be two, and the non-metallic element can be a halide atom. In this case, the intermediate reaction compound can comprise molecules of a transition metal dichloride. If the elemental metal is titanium, the intermediate reaction compound can comprise titanium dichloride. Surfaces of the metal coating 230 on the chuck 220 underneath the gap provides metal surfaces at which the intermediate reaction compound is generated.

The intermediate gaseous compound diffuses from the surfaces of the metal coating 230 upward toward the backside surface of the substrate 250 and toward the front surface of the substrate 250 along intermediate gaseous compound flow paths 270 as illustrated in FIG. 2. Thus, the general flow direction of the metal precursor gas can be from the showerhead 290 toward the chuck 220, and the general flow direction of the intermediate gaseous compound formed by reaction of the metal precursor gas with the metal coating 230 on the chuck 220 can be from the chuck 220 toward the showerhead 290.

A metal layer 260 that covers the entire physically exposed surface of the substrate 250 can be formed on the front side surface of the substrate 250 and on the backside surface of the substrate 250. The metal layer 260 deposited on the substrate 250 can be formed by thermal decomposition of the intermediate reaction compound without use of plasma energy. Thermal decomposition of the intermediate reaction compound provides conformal deposition of the metal layer 260 on non-planar features on the substrate 250.

While the thickness of the metal layer 260 can be substantially uniform at all physically exposed locations at which the deposition of the metal layer 260 can occur, deposition of the elemental metal of the metal layer 260 may depend on certain types of physically exposed surfaces, such as a non-hydrophilic surface. A surface of a semiconductor material (such as a silicon surface) and a surface of silicon oxide are examples of non-hydrophilic surfaces. A surface of silicon oxide is an example of a hydrophilic surface. Thus, the metal layer 260 may be deposited as a single continuous layer having a substantially same thickness throughout on the substrate 250, or may be formed as multiple elemental metal layers having a substantially same thickness throughout and spaced apart among one another by regions in which deposition of the elemental metal is suppressed due to surface properties.

Deposition of the metal layer 260 on the substrate 250 can be performed by the thermal decomposition of the metal precursor gas without formation of a plasma generated by application of radio frequency power. Whereas a plasma-enhanced chemical vapor deposition process deposits a material only within areas that are directly exposed to the plasma of molecules that generates an elemental metal in a non-compound form, a thermal chemical vapor deposition process can form a metal layer 260 of a uniform thickness wherein a physically exposed surface is present. Thus, the thermal chemical vapor deposition process used to deposit the elemental metal according to various embodiments can deposit the metal layer 260 inside via cavities having high aspect ratios and embedded via cavities in a shielded configuration, i.e., a configuration in which overlying structural components are present over the embedded via cavities. In one embodiment, the substrate 250 comprises at least one via cavity having an undercut region, and the coating of the elemental metal provided by the metal layer 260 can be formed conformally within the undercut region.

In one embodiment, the chuck 220 can be heated to an elevated temperature greater than 300 degrees Celsius, such as greater than 400 degrees Celsius, during deposition of the metal layer 260 on the substrate 250. In one embodiment, the elevated temperature used during deposition of the metal layer 260 on the substrate 250 can be in a range from 400 degrees to 650 degrees. The substrate 250 can be at a temperature that is the same as, or less than, the elevated temperature during deposition of the metal layer 260.

By suspending the substrate 250 can over the chuck 220, such as by a set of pins 222, a gap of a substantially uniform height can be present between the substrate 250 and the chuck 220 during deposition of the metal layer 260. The uniform height of the gap between the substrate 250 and the chuck 220 can be in a range from 1 mm to 50 mm, such as from 3 mm to 30 mm, although lesser and greater uniform heights can also be used.

The metal layer 260 is deposited by the thermal chemical vapor deposition process on all physically exposed surfaces of the substrate 250. Thus, the metal layer 260 is deposited on a backside of the substrate 260 that faces the gap and on a front side of the substrate 250 that is located on an opposite side of the backside and faces the showerhead 290. While the deposition rate of the elemental metal in the metal layer 260 is primarily determined by the temperature of the substrate 250, thereby enabling a conformal deposition process, the supply rate of the intermediate reaction compound to the backside of the substrate 250 can be greater than the supply rate of the intermediate reaction compound to the front side of the substrate 250. The difference in the supply rates between the back surface of the substrate 250 and the front surface of the substrate 250 can lead to a small difference in the deposition rate of the elemental metal across the back surface of the substrate 250 and the front surface of the substrate 250. Specifically, the metal layer 250 may be deposited at a higher deposition rate on the backside of the substrate 250 than on the front side of the substrate 250 under some process conditions.

Figure 4:
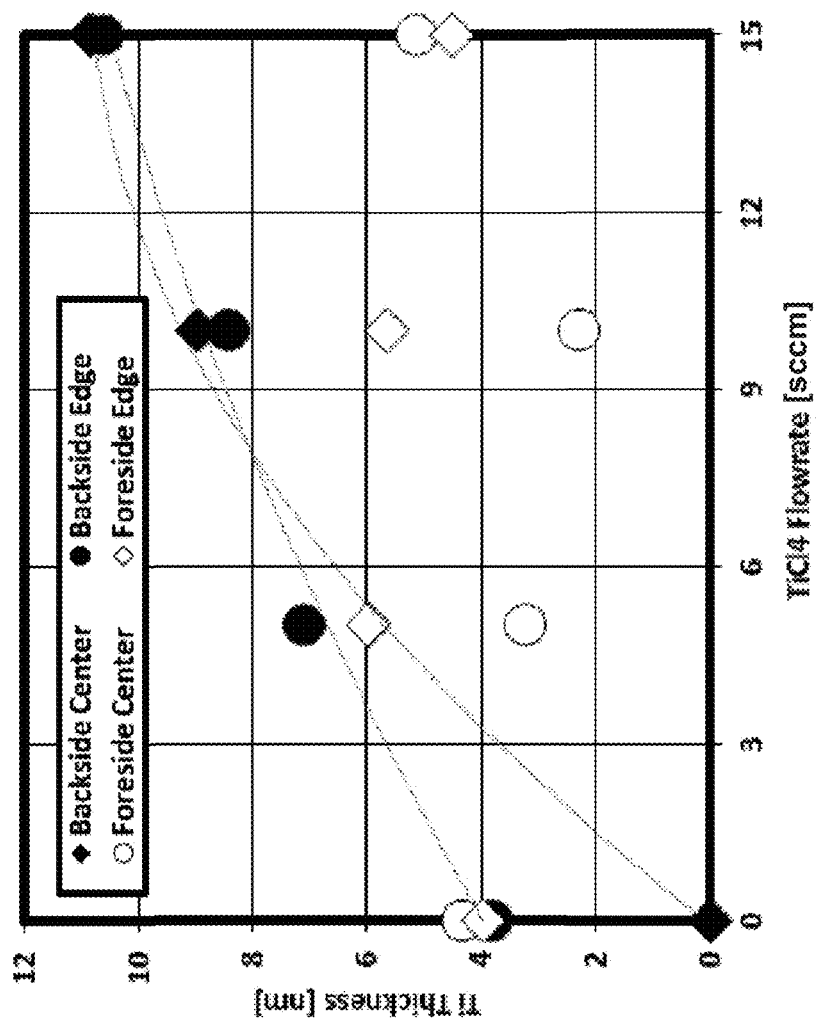
FIG. 4 is a graph illustrating a measured thickness distribution of a titanium layer deposited within the first exemplary chemical vapor deposition tool at various locations of a substrate according to an embodiment of the present disclosure.

FIG. 4 is a graph showing the thickness distribution of a titanium layer as measured at various locations of a substrate 250 following deposition of the titanium layer within the first exemplary chemical vapor deposition tool of FIG. 2 using the thermal chemical vapor deposition process of an embodiment. Generally, the thickness of the deposited titanium layer is greater on the backside of the substrate 250 than on the front side of the substrate 250 for various flow rates for $TiCl_4$ due to the difference in the supply rate of $TiCl_2$ from the titanium coating on the chuck 220. Generally, the thickness of the deposited titanium layer on the backside of the substrate 250 has a lesser thickness variation across a center region and an edge region than the thickness of the deposited titanium layer on the front side of the substrate 250. The thickness variation across the center region and the edge region for the front side of the titanium layer decreases with an increase in the flow rates for $TiCl_4$. It is believed that the thickness differential between the portions of the titanium layer on the backside of the substrate 250 and the portions of the titanium layer on the front side of the substrate 250 will decrease with an increase in the flow rate of $TiCl_4$ because more $TiCl_2$ molecules would become available on the front side of the substrate 250.

Referring back to step 350 of FIG. 3, during processing of the substrate, the intermediate reaction compound (such as $TiCl_2$) can be formed at least partly by formation a compound of an atom of the elemental metal (such as Ti) that is detached from the metal coating 230 through reaction with a molecule of the metal precursor gas (such as $TiCl_4$). Further, the intermediate reaction compound can be formed partly by dissociation of at least one atom of the non-metallic element (such as two chlorine atoms) from a molecule of the metal precursor gas upon reaction with the elemental metal within the metal coating 230. In one embodiment, the elemental metal is titanium, the metal precursor gas comprises titanium tetrachloride, and the intermediate reaction compound comprises titanium dichloride that is formed partly by reaction of titanium atoms in the metal coating 230 with molecules of titanium tetrachloride and partly by dissociation of chlorine from molecules of titanium tetrachloride. This process is schematically illustrated in FIG. 1A. The thickness of the metal layer 260 may be in a range from 5 nm to 100 nm, such as from 10 nm to 50 nm, although lesser and greater thicknesses can also be used.

If formation of the metal layer 260 on the substrate 250 is the end of the processing using the thermal chemical deposition chamber, the substrate 250 with the conformal metal layer 260 thereupon can be unloaded from the metallic material deposition chamber 202 in step 360, such as by a robotic blade attached to a robotic arm.

If a metal nitride layer (such as a TiN layer) is to be formed on the conformal metal layer using the thermal chemical deposition chamber, an additional processing operation can be performed as part of step 350 prior to extraction of the substrate 250 from the metallic material deposition chamber 202 in step 360. Specifically, a thermal nitridation process can be performed on the metal layer 260 to convert at least a surface portion of the metal layer 260 into a metal nitride layer. In this case, as part of step 350 a nitridation gas such as ammonia can be flowed into the metallic material deposition chamber 202 while the substrate 250 is at an elevated temperature. The temperature of the thermal nitridation process may be in a range from 600 degrees Celsius to 1,000 degrees Celsius, such as from 700 degrees Celsius to 900 degrees Celsius, although lesser and greater temperatures can also be used. The thickness of the metal nitride layer formed by the nitridation process may be in a range from 2 nm to 30 nm, such as from 4 nm to 10 nm, although lesser and greater thicknesses can also be used. Subsequently, step 360 can be performed to transfer the substrate 250 with the metal nitride layer out of the metallic material deposition chamber 202.

Referring to step 370, a post-processing chamber conditioning process may be optionally performed after removing the substrate 250 from the metallic material deposition chamber 202. For example, a plasma-assisted nitridation process can be performed in the metallic material deposition chamber 202. The post-processing chamber conditioning process can be useful if the metallic material deposition chamber 202 is used to form a metal nitride layer through thermal nitridation after deposition of the metal layer 260 on the substrate 250. In this case, the next substrate to be processed is placed within a same environment as the previously processed substrate 250.

Referring to step 380, if there are additional substrates to be processed, the method 300 can be repeated beginning at step 330 as described. If all substrates have been processed, the processing may be terminated in step 390.

Figure 5A:
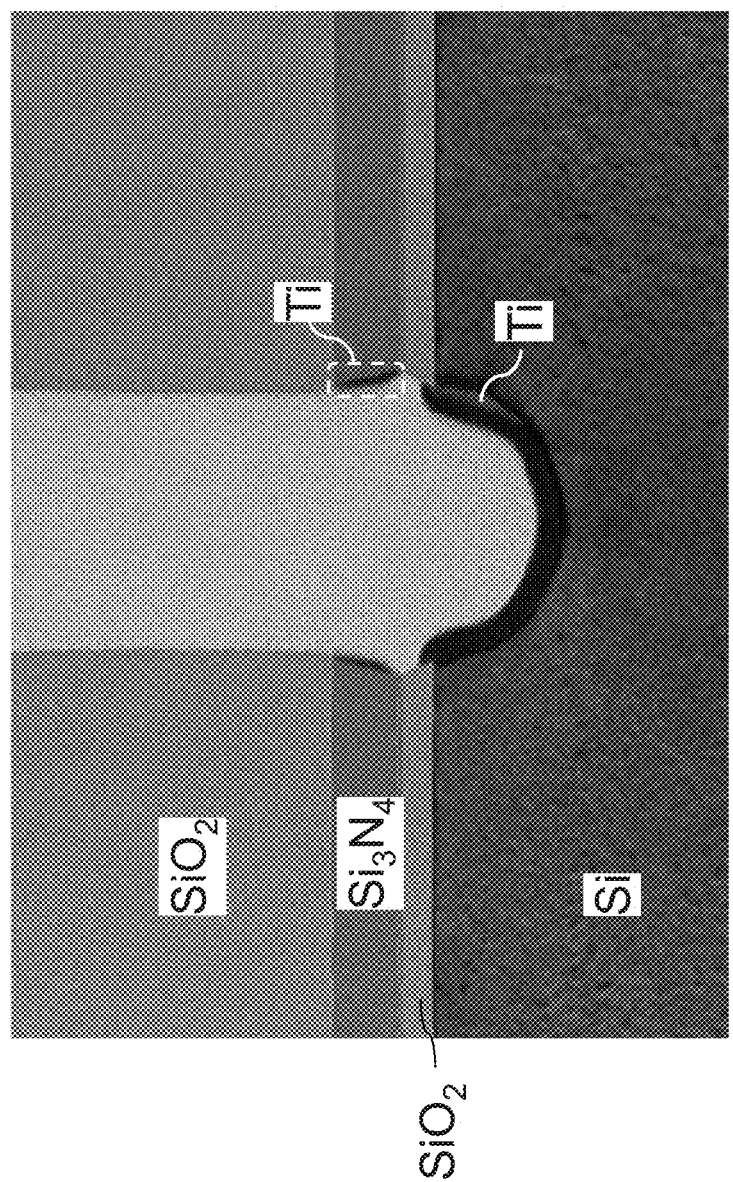
FIG. 5A is a scanning electron micrograph of a via cavity in which titanium portions were deposited using a thermal titanium chemical vapor deposition process according to an embodiment of the present disclosure.
Figure 5B:
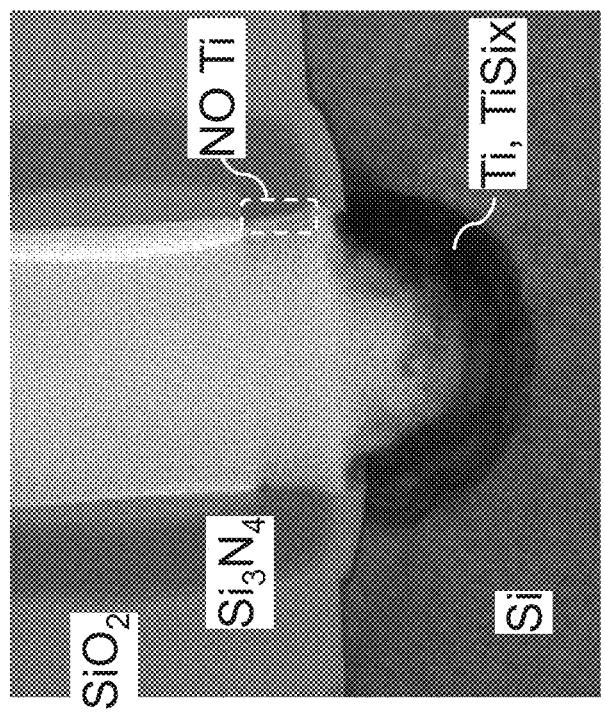
FIG. 5B is a scanning electron micrograph of a via cavity in which titanium portions were deposited using a conventional plasma-assisted metal deposition (PECVD) process.

Referring to FIGS. 5A and 5B, scanning electron micrographs of a via cavity are shown. FIG. 5A shows the via cavity after titanium portions were deposited using a thermal chemical vapor deposition process according to an embodiment of the present disclosure. The titanium portions include a contoured titanium plate formed at the bottom of a high aspect ratio via cavity directly on a top surface of a silicon layer, and an annular titanium ring formed on a sidewall of the via cavity directly on a surface of a silicon nitride layer. The silicon oxide surfaces suppress nucleation of titanium during the thermal titanium chemical vapor deposition process, and thus, titanium is not deposited on the sidewalls of the silicon oxide layers. In this case, selective deposition of titanium on the physically exposed surfaces of the silicon layer and the silicon nitride layer can be achieved. In contrast, FIG. 5B shows the via cavity after titanium deposition using a conventional PECVD-Ti process. In particular, FIG. 5B shows no titanium deposition occurred in a "shadowed area" even on the silicon nitride layer.

Figure 6B:
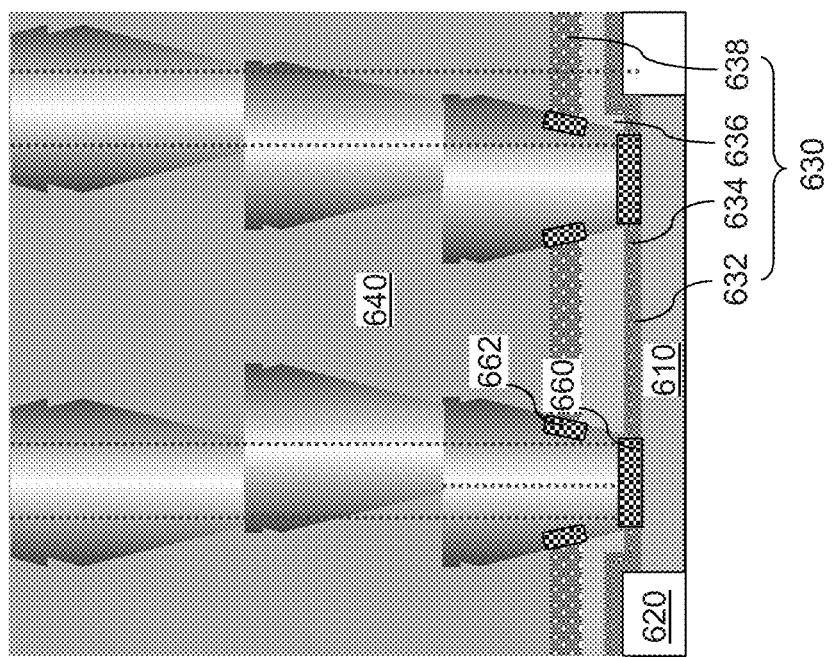
FIG. 6B is a schematic vertical cross-sectional view of an exemplary structure formed by thermal titanium chemical vapor deposition process according to an embodiment of the present disclosure.
Figure 6A:
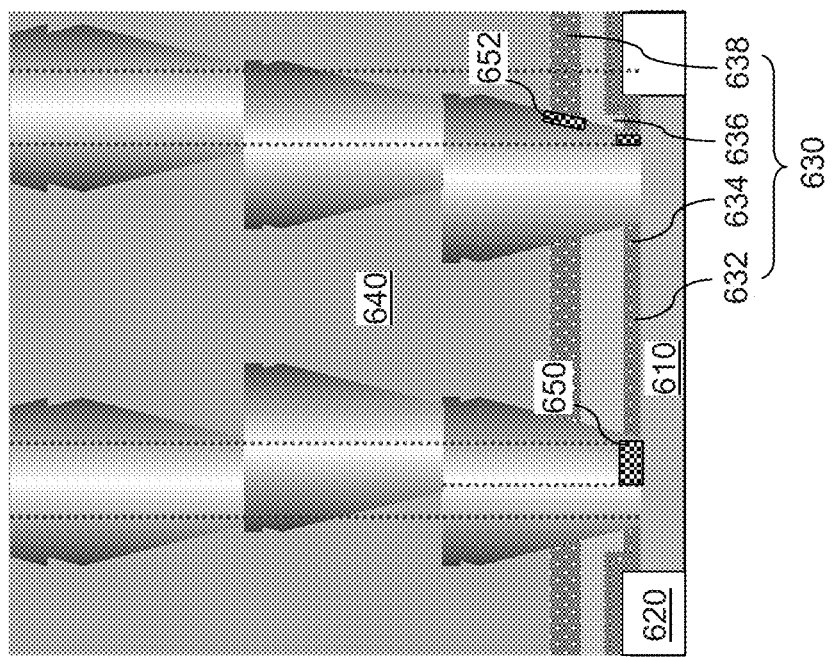
FIG. 6A is a schematic vertical cross-sectional view of a prior art structure formed by plasma-enhanced chemical vapor deposition of titanium.

Referring to FIGS. 6A and 6B, schematic vertical cross-sectional views of via cavity structures illustrate the advantage provided by the thermal metal chemical vapor deposition process of various embodiments. FIG. 6A is a schematic vertical cross-sectional view of a prior art structure formed by plasma-enhanced chemical vapor deposition of titanium. FIG. 6B is a schematic vertical cross-sectional view of an exemplary structure formed by chemical vapor deposition process according to an embodiment of the present disclosure.

The structures illustrated in FIGS. 6A and 6B includes a silicon substrate 610, shallow trench isolation structures 620 embedded in an upper portion of the silicon substrate 610, a set of dielectric liners 630 that can include, for example, a first dielectric liner 632, a second dielectric liner 634, a third dielectric liner 636, and a fourth dielectric liner 638, and interconnect level dielectric material layers 640. The first dielectric liner 632, the second dielectric liner 634, the third dielectric liner 636, and the fourth dielectric liner 638 can include various dielectric materials as needed. For example, the first dielectric liner 632 can include silicon oxide, the second dielectric liner 634 can include silicon nitride, the third dielectric liner 636 can include silicon oxide, and the fourth dielectric liner 638 can include silicon nitride. The interconnect level dielectric material layers 640 can include various silicon-oxide based materials such as undoped silicate glass, a doped silicate glass, and/or organosilicate glass.

A stack of via cavities with various lateral misalignment thereamongst can be formed through the set of dielectric liners 630 and the interconnect level dielectric material layers 640. For example, the interconnect level dielectric material layers 640 can be deposited layer by layer with respective via cavities filled with sacrificial via fill material portions. The sacrificial via fill material portions can include a sacrificial material that can be removed selective to the materials of the set of dielectric liners 630 and the interconnect level dielectric material layers 640. For example, the sacrificial via fill material portions can include amorphous silicon or polysilicon (which can be used in combination of a sacrificial liner such as a silicon oxide liner on the silicon substrate 610), a silicon-germanium alloy, amorphous carbon or diamond-like carbon, a silicon-based polymer, or organosilicate glass or borosilicate glass (in case the interconnect level dielectric material layers 640 include undoped silicate glass). Each level of an interconnect level dielectric material layer 640 and embedded sacrificial via fill material portions can be formed on the silicon substrate 610 or over a pre-existing level of an underlying interconnect level dielectric material layer 640 and embedded sacrificial via fill material portions therein. After formation of multiple levels of interconnect level dielectric material layers 640 and embedded sacrificial via fill material portions, the sacrificial via fill material portions can be removed selective to the interconnect level dielectric material layers 640 to provide stacks of via cavities with lithographic misalignment thereamongst.

The prior art structure of FIG. 6A can be formed by depositing titanium using a plasma-enhanced chemical vapor deposition (PECVD) process. Process gases including titanium tetrachloride, argon, and hydrogen are flowed into a PECVD process chamber including a substrate with stacks of via cavities, and a plasma is generated in the PECVD process chamber by applying RF power into the gas mixture of the process gases. Directional deposition of titanium occurs on physically exposed surface that include materials that provide titanium nucleation and located within "line-of-sight" directions from the plasma region within the PECVD process chamber. As used herein, a "line-of-sight" direction refers to any directions in space that are unimpeded by presence of an intervening object. Planar titanium material portions 650 can be deposited only on portions of physically exposed surfaces of the silicon substrate 610 that are not covered by any overlying portions of the interconnect level dielectric material layers 640 that impede the line-of-sight directions from the plasma region. Further, sidewall titanium material portions 652 can be deposited on portions of dielectric liners (such as the fourth dielectric liner 638 including silicon nitride) including a dielectric material on which titanium can nucleate. The sidewall titanium material portions 652 can be deposited only on portions of physically exposed surfaces of the dielectric liners 630 that are not covered by any overlying portions of the interconnect level dielectric material layers 640 that impede the line-of-sight directions from the plasma region, and include a dielectric material on which titanium can nucleate. Generally, the stacked via cavities may be laterally misaligned among one another due to inherent lithographic overlay variations, and thus, some portions of the physically exposed surfaces of the silicon substrate 610 may not be covered by any deposited titanium material portion. Further, some sidewalls surfaces of the dielectric liners including a material that provides nucleation of titanium are covered by an overhanging portion of the interconnect level dielectric material layers 640, and thus, may remain uncovered after the titanium deposition process. Thus, the PECVD titanium deposition process used to form the prior art structure of FIG. 6A does not provide complete coverage of all surfaces on which titanium can nucleate due to the shadowing effect of overhanging portions of the interconnect level dielectric material layers 640 during the PECVD titanium deposition process.

The structure of FIG. 6B according to an embodiment of the present disclosure can be formed by depositing titanium using a thermal titanium chemical vapor deposition (CVD) process as described above. A titanium coating 230 on a chuck 220 is used to generate titanium dichloride molecules from titanium tetrachloride molecules, and thermal reaction of titanium dichloride with hydrogen is used to deposit titanium on physically exposed surfaces that are conductive to nucleation of titanium. Planar titanium material portions 660 can be deposited on all physically exposed surfaces of the silicon substrate 610. Thus, the planar titanium material portions 660 are formed even under overhang regions of the interconnect level dielectric material layers 640. Further, sidewall titanium material portions 662 can be deposited on all physically exposed surfaces of the dielectric liners 630 that include a material that is conducive to nucleation of titanium. Deposition of titanium in the thermal titanium CVD process is not limited by any line-of-sight. Thus, the thermal titanium CVD process used to form the structure of FIG. 6B provides complete coverage of all surfaces on which titanium can nucleate.

Generally, a thermal chemical vapor deposition process can be used to form a conformal metal film on a substrate. The substrate may include various semiconductor devices and metal interconnect structures, and may additionally include various via cavities having high aspect ratios or embedded via cavities in a shielded configuration, i.e., a configuration in which overhanging structural components are present over the embedded via cavities. In such cases, conformity of the deposition process facilitates forming a metallic material at the bottom of such via cavities having high aspect ratios or within the embedded via cavities in a shielded configuration. Thermal chemical vapor deposition can provide such high conformity, while an RF-assisted deposition processes do not provide deposition of a material at the bottom of high aspect ratio via cavities or within embedded via cavities in a shielded configuration. Generally, the substrate can comprises at least one via cavity having an undercut region, and the coating of the elemental metal deposited by a thermal metal chemical vapor deposition process can be formed conformally within the undercut region. As used herein, an "undercut region" refers to a region underneath an overhanging structure.

Figure 7:
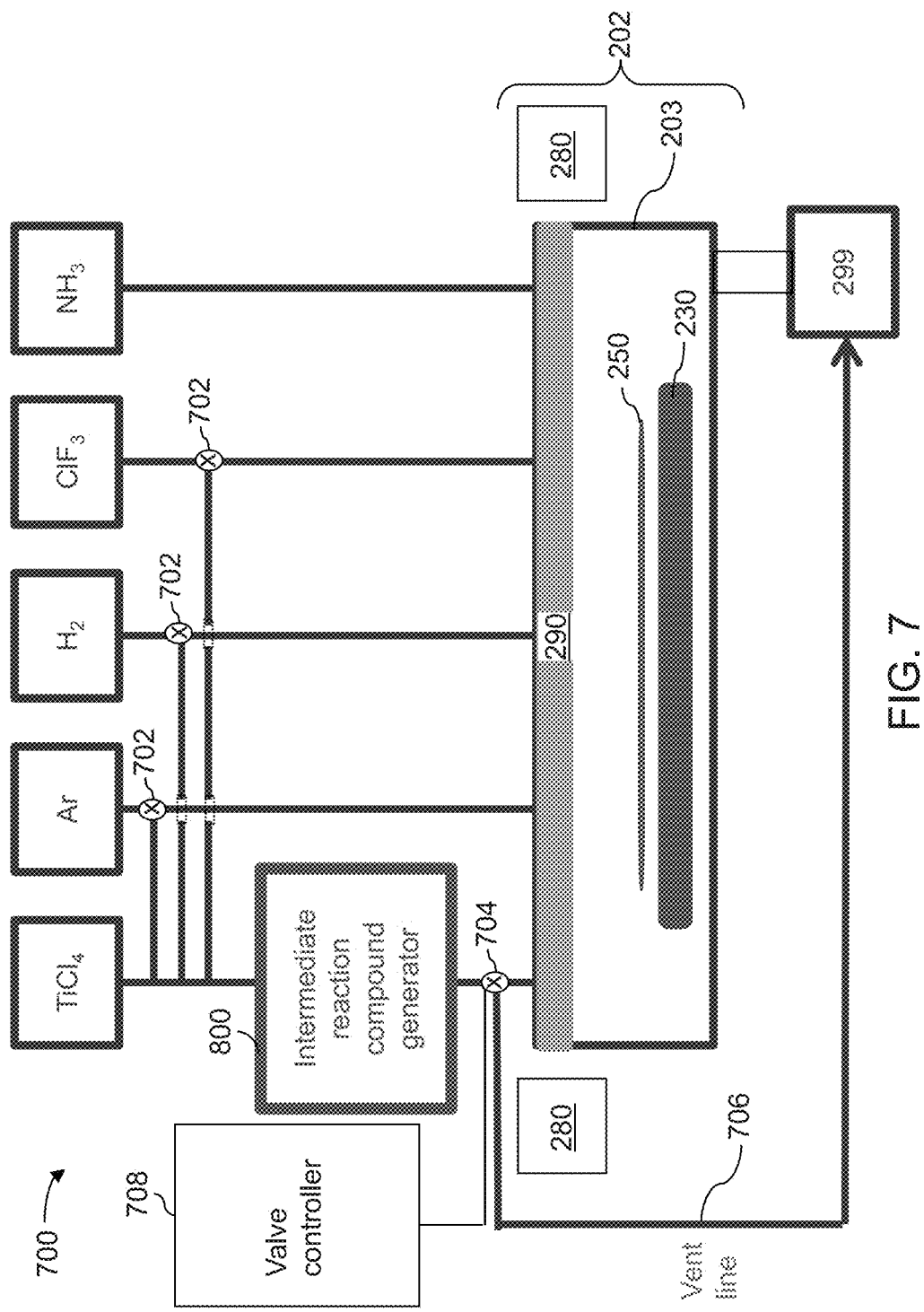
FIG. 7 is a schematic view of a second exemplary thermal chemical vapor deposition tool according to an embodiment of the present disclosure.

Referring to FIG. 7, a second exemplary chemical vapor deposition tool 700 according to an embodiment of the present disclosure can be derived from the first exemplary chemical vapor deposition tool 200 of FIG. 2 by modifying a delivery line for the metal precursor gas by adding an in-line intermediate reaction compound generator 800. The delivery lines for additional process gases such as the argon and hydrogen, and the delivery line for the etchant gas such as $ClF_3$ or $NF_3$ can be modified to provide re-direction of the gas flow into the in-line intermediate reaction compound generator 800. For example, two-way valves 702 can be connected between the showerhead 290 and the each of the argon source, the hydrogen source, and the etchant source such that the gas flow can be directed to the showerhead 290 or to the in-line intermediate reaction compound generator 800. The re-directed gases can be provided to the input side of the in-line intermediate reaction compound generator 800.

Figure 8:
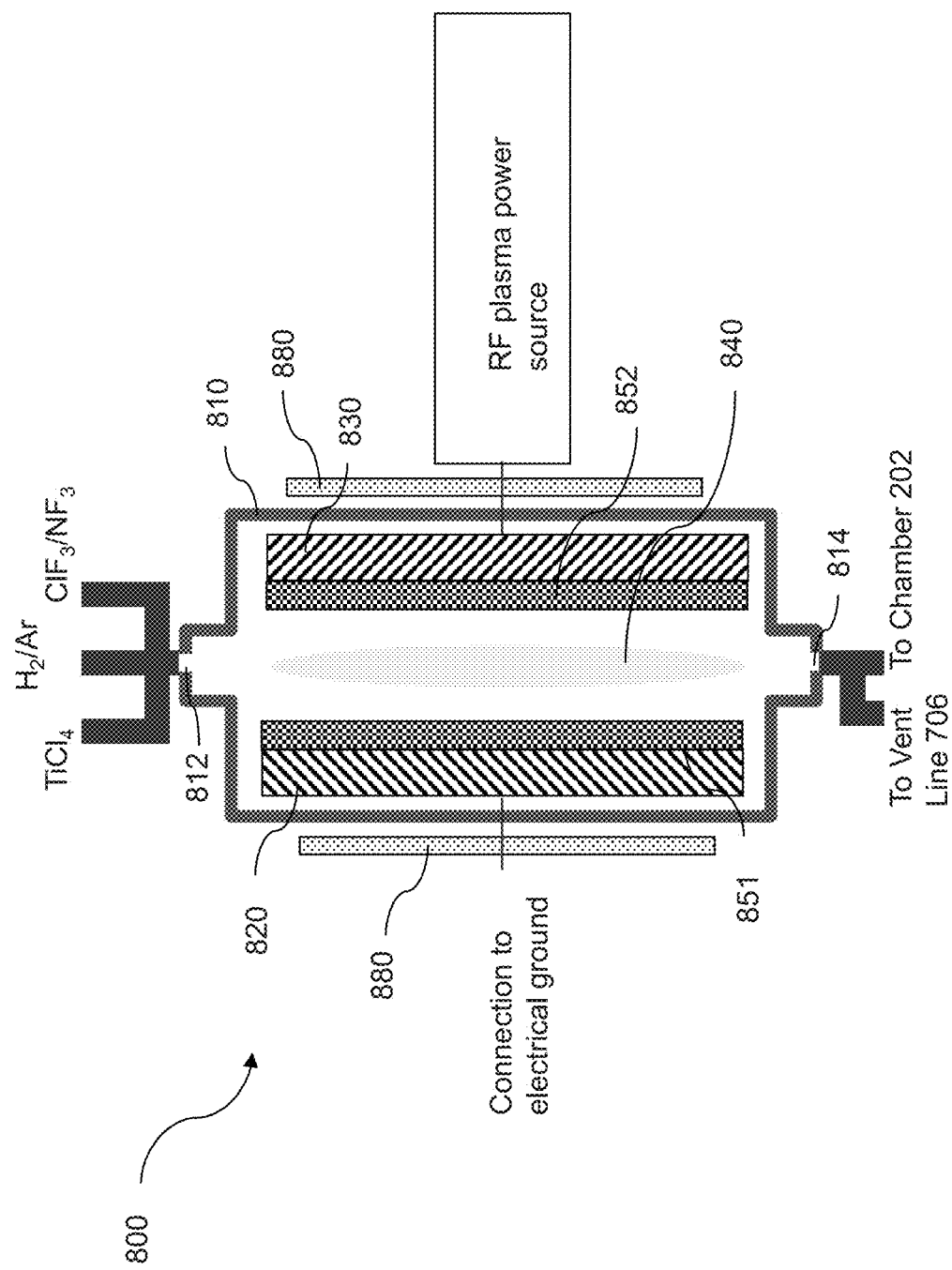
FIG. 8 is a schematic view of a first in-line intermediate reaction compound generator according to an embodiment of the present disclosure.

Referring to FIG. 8, a first in-line intermediate reaction compound generator 800 that can be incorporated into the second exemplary chemical vapor deposition tool 700 of FIG. 7 is illustrated. The first in-line intermediate reaction compound generator 800 includes an intermediate reaction compound generator enclosure 810 that is vacuum-tight and provided with an inlet orifice 812 and an outlet orifice 814.

The first in-line intermediate reaction compound generator 800 includes at least one metal portion (851, 851) that consists essentially of the elemental metal contained within the metal precursor gas and the intermediate reaction compound. For example, if the metal precursor gas comprises titanium tetrachloride, the at least one metal portion (851, 852) can consist essentially of titanium. The at least one metal portion (851, 852) can be physically exposed to the flow path of the metal precursor gas so that the metal precursor gas can react with the metal in the at least one metal portion (851, 852) and generate the intermediate reaction compound derived from the metal and the metal precursor gas. For example, if the at least one metal portion (851, 852) consists essentially of titanium and if the metal precursor gas includes titanium tetrachloride, the intermediate reaction compound can include titanium dichloride that is provided partly from the metal precursor gas of titanium tetrachloride by dissociating two chlorine atoms and partly from the elemental metal of the at least one metal portion (851, 852) by combination with two chlorine atoms.

In one embodiment, the first in-line intermediate reaction compound generator 800 can be provided with at least one heater (880, 820, 830) with a temperature control mechanism (such as a thermocouple and temperature control circuitry not shown). The at least one heater (880, 820, 830) may be located outside an enclosure for confining the flow of gases through the first in-line intermediate reaction compound generator 800, or may be located within the enclosure for confining the flow of gases. The at least one heater (880, 820, 830) can be configured to elevate the temperature of the at least one metal portion (851, 852) to an elevated temperature at which thermal decomposition of the metal precursor gas into the intermediate reaction compound at the surfaces of the at least one metal portion (851, 852) is facilitated. For example, the elevated temperature may be in a range from 300 degrees Celsius to 800 degrees Celsius, such as from 400 degrees to 750 degrees Celsius. In one embodiment, the at least one heater (880, 820, 830) can be configured to provide an elevated temperature greater than 600 degrees Celsius to the at least one metal portion (851, 852).

In one embodiment, the at least one metal portion (851, 852) may include a first metal plate 851 located directly on a first electrode 820 that includes a first heater (not expressly shown), and a second metal plate 852 located directly on a second electrode 830 that includes a second heater (not expressly shown). The first electrode 820 and the first metal plate 851 can be heated to an elevated temperature that facilitates generation of the intermediate reaction compound (such as titanium dichloride) during a metal deposition step that occurs inside the metallic material deposition chamber 202, and the second electrode 830 and the second metal plate 852 can be heated to the elevated temperature to facilitate generation of the intermediate reaction compound during the metal deposition step. Alternatively and/or additionally, an external heater 880 may be provided outside the enclosure for confining the flow of gases.

In addition, the first in-line intermediate reaction compound generator 800 can include a radio frequency (RF) plasma power source configured to generate a plasma 840 of the metal precursor gas and to induce deposition of a metal derived from decomposition of the metal precursor gas on the at least one metal portion (851, 852). For example, the first metal plate 851 can have a first planar surface that is physically exposed to a path of the metal precursor gas and electrically grounded through the first electrode 820, and a second metal plate 852 can have a second planar surface that is physically exposed to the path of the metal precursor gas, parallel to the first planar surface, and is connected to a radio frequency bias voltage from the RF plasma power source for generation of a plasma 840 of the metal precursor gas in a volume between the first planar surface and the second planar surface. In this case, the first electrode 820 can be a ground electrode contacting a backside surface of the first metal plate 851 and connected to electrical ground, and the second electrode 830 can be a radio frequency application electrode contacting a backside surface of the second metal plate 852 and connected to a radio frequency bias voltage generator (i.e., the RF plasma power source) that generates the radio frequency bias voltage.

The RF plasma in the first in-line intermediate reaction compound generator 800 can be used to induce deposition of the elemental metal from the metal precursor gas on the surfaces of the first metal plate 851 and the second metal plate 852. During deposition of the metal in the metallic material deposition chamber 202, the material of the first metal plate 851 and the second metal plate 852 is consumed as the metal precursor gas reacts with the material of the of the first metal plate 851 and the second metal plate 852 to generate the intermediate reaction compound. With usage, the first metal plate 851 and the second metal plate 852 become thinner. Without deposition of additional metal on the first metal plate 851 and the second metal plate 852, all metal on the first metal plate 851 and the second metal plate 852 would eventually be used up, and the first in-line intermediate reaction compound generator 800 would need to be replaced with a new unit. Deposition of the metal on the surfaces of the first metal plate 851 and the second metal plate 852 replenishes the metal in the first metal plate 851 and the second metal plate. This enables use of the first in-line intermediate reaction compound generator 800 in a semi-permanent operational mode in which the material of the first metal plate 851 and the second metal plate 852 is replenished through a PECVD deposition process in which the metal from the metal precursor gas is added to the first metal plate 851 and the second metal plate 852, thereby thickening the first metal plate 851 and the second metal plate 852.

Referring back to FIG. 7, the exhaust side of the in-line intermediate reaction compound generator can have a switchable vent valve 704 configured to select the destination of the flow of the exhaust gas from the in-line intermediate reaction compound generator 800 between the metallic material deposition chamber 202 and a vent line 706 connected to the vacuum pump system 299. A valve controller 708 can be provided to control the various valves 702 located in the gas delivery lines so that the various gases from the gas sources can flow directly into the showerhead 290 or into the in-line intermediate reaction compound generator 800, and so that the gas exiting the in-line intermediate reaction compound generator 800 can flow into the showerhead 290 or bypass the metallic material deposition chamber 800 via the vent line 706.

Figures 9A, 9B:
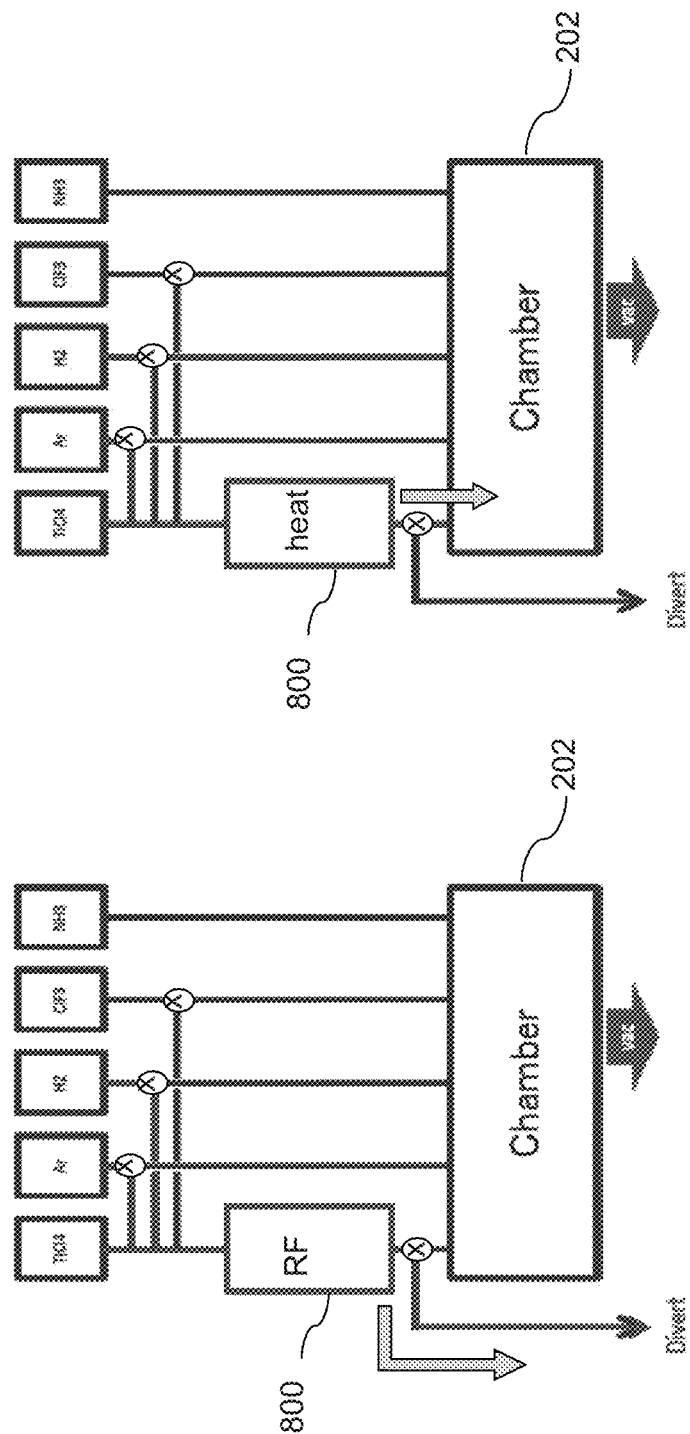
FIG. 9A is a schematic diagram of a gas flow configuration of the second exemplary chemical deposition tool during a titanium deposition step in the in-line intermediate reaction compound generator according to an embodiment of the present disclosure.
FIG. 9B is a schematic diagram of a gas flow configuration of the second exemplary chemical deposition tool during titanium deposition on a substrate in a deposition chamber according to an embodiment of the present disclosure.

Referring to FIGS. 9A and 9B, two operational modes of the second exemplary CVD tool 700 are illustrated. FIG. 9A represents a first operational mode that is used during a titanium deposition step in the in-line intermediate reaction compound generator 800 according to an embodiment of the present disclosure. FIG. 9B represents a second operational mode that is used during titanium deposition on a substrate 250 in the metallic material deposition chamber 202 according to an embodiment of the present disclosure.

Referring to FIG. 9A, an elemental metal is deposited on the at least one metal portion (851, 852) in the first operational mode of the second exemplary CVD tool 700. The metal precursor gas (such as titanium tetrachloride) and additional process gases (such as argon and hydrogen) are provided into the intermediate reaction compound generator enclosure 810. RF plasma bias voltage is applied to the second electrode 830 while the first electrode 820 is grounded to generate a plasma 840 of the metal precursor gas and additional process gases, and to induce deposition of an elemental metal on the physically exposed surfaces of the at least one metal portion (851, 852). The exhaust gas from the first in-line intermediate reaction compound generator 800 can be vented directly into the vacuum pump system 299 by bypassing the metallic material deposition chamber 202 via the vent line 706, or may be flowed into the metallic material deposition chamber 202 in the absence of any substrate 250 therein. Deposition of the elemental metal derived from the metal precursor gas onto the surfaces of the at least one metal portion (851, 852) can continue until a metal film of a sufficient thickness is formed on the surfaces of the at least one metal portion (851, 852). For example, the thickness of the at least one metal portion (851, 852) may be in a range from 10 microns to 10 mm, such as from 40 microns to 2.5 mm, after thickening the at least one metal portion (851, 852) through deposition of the elemental metal in the first operational mode.

Referring to FIG. 9B, a substrate 250 is loaded into the metallic material deposition chamber, and the elemental metal is deposited on the physically exposed surfaces of the substrate 250 in the second operational mode of the second exemplary CVD tool 700. The metal precursor gas (such as titanium tetrachloride) and additional process gases (such as hydrogen) are provided into the in-line intermediate reaction compound generator 800. The at least one heater (820, 830, 880) of the in-line intermediate reaction compound generator 800 is turned on to elevate the temperature of the at least one metal portion (851, 852) to a temperature at which the metal precursor gas interacts with the elemental metal of the at least one metal portion (851, 852) to generate an intermediate reaction compound (such as titanium dichloride). The elemental metal within the at least one metal portion (851, 852) can be consumed to supply a significant portion (which may be in a range from 20% to 80% such as about 50%) of the intermediate reaction compound. The exhaust gas from the first in-line intermediate reaction compound generator 800 includes molecules of the intermediate reaction compound, and can be directed into the showerhead 290 of the metallic material deposition chamber 202. Deposition of the elemental metal derived from the intermediate reaction compound occurs on the physically exposed surfaces of the substrate 250 that permit nucleation of the elemental metal. The substrate 250 may exit the metallic material deposition chamber 202 with a metal layer consisting essentially of the elemental metal, or a subsequent nitridation process can be performed to convert at least a surface portion of the metal layer into a metal nitride layer before the substrate 250 exits the metallic material deposition chamber 202. In one embodiment, multiple substrates 250 can be processed before the elemental metal of the at least one metal portion (851, 852) is replenished by operating the in-line intermediate reaction compound generator 800 in the first operational mode. Alternatively, the duration of the first operational mode may be short enough to provide only the amount of the elemental metal that is consumed in one cycle of the second operational mode, and the first operational mode and the second operational mode may alternate every time a substrate 250 is processed.

Figure 10:
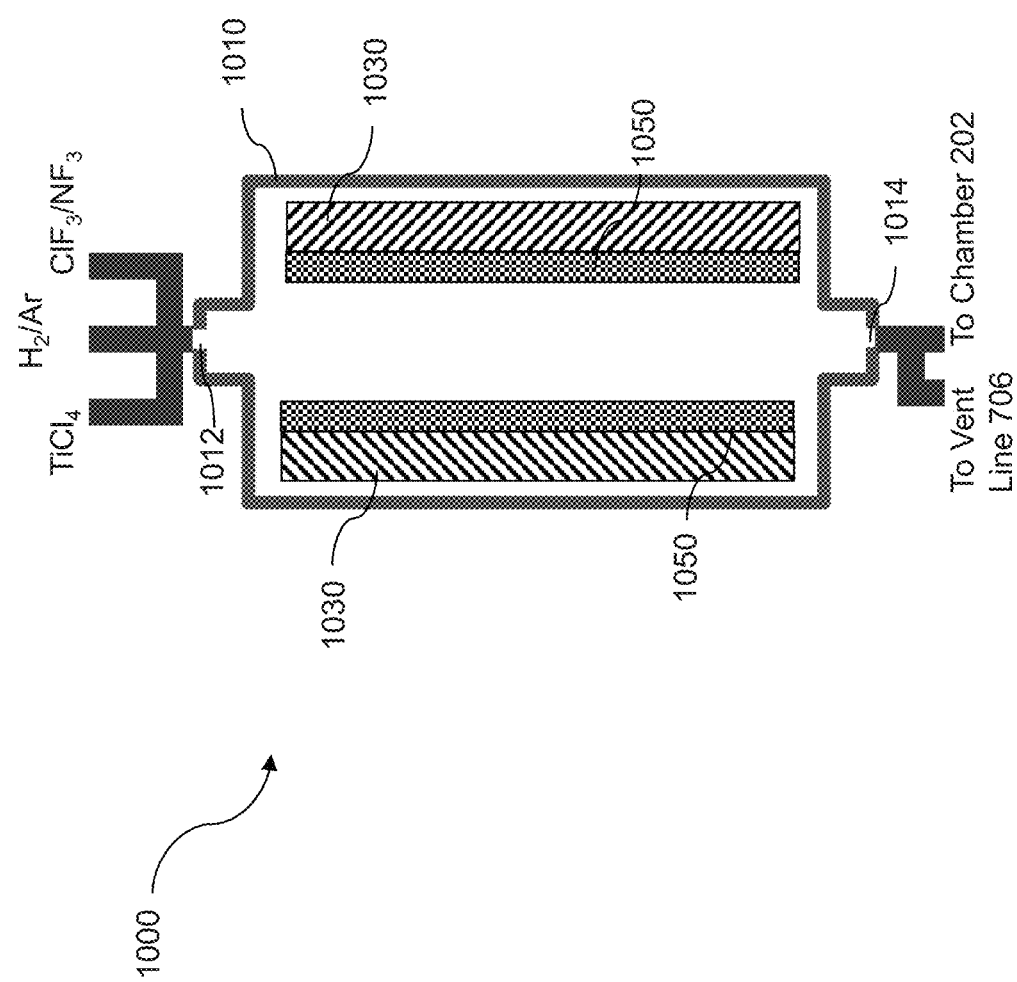
FIG. 10 is a schematic view of a second in-line intermediate reaction compound generator according to an embodiment of the present disclosure.

Referring to FIG. 10, a second in-line intermediate reaction compound generator 1000 according to an embodiment of the present disclosure is illustrated. The second in-line intermediate reaction compound generator 1000 may be used in lieu of the first in-line intermediate reaction compound generator 800 within the second exemplary chemical vapor deposition tool illustrated in FIG. 7.

The second in-line intermediate reaction compound generator 1000 includes an intermediate reaction compound generator enclosure 1010 that is vacuum-tight and provided with an inlet orifice 1012 and an outlet orifice 1014. The second in-line intermediate reaction compound generator 1000 is configured for thermal chemical vapor deposition (CVD) of an elemental metal on at least one metal portion 1050, and for thermal generation of an intermediate reaction compound from the at least one metal portion 1050. In order to provide the thermal CVD on the surfaces of the at least one metal portion 1050, the second in-line intermediate reaction compound generator 1000 is configured to induce thermal decomposition of the metal precursor gas, and to induce deposition of a metal derived from decomposition of the metal precursor gas on the at least one metal portion. At least one heater 1030 can be provided on the at least one metal portion 1050. The at least one heater 1030 may be isolated from the gas stream by an inert material (such as a ceramic material) to avoid undesirable thermal reaction between the material of the at least one heater 1030 and the metal precursor gas.

In one embodiment, a cylindrical configuration may be used for the at least one metal portion 1050 and for the at least one heater 1030. For example, the at least one metal portion 1050 can comprise a metal tube that is configured to pass the metal precursor gas therethrough, and the at least one heater 1030 can comprise a cylindrical heater that laterally surrounds the metal tube.

The second in-line intermediate reaction compound generator 1000 can be operated in the same manner as the first in-line intermediate reaction compound generator 800 as described above. During a first operational mode of the second in-line intermediate reaction compound generator 1000, an elemental metal (such as titanium) can be deposited on the at least one metal portion 1050 by a thermal CVD process. In this case, the at least one metal portion 1050 can be heated to an elevated temperature greater than 300 degrees Celsius, such as greater than 400 degrees Celsius, for deposition of the elemental derived from the metal precursor gas. In one embodiment, the elevated temperature used during deposition of the elemental metal on the at least one metal portion 1050 can be in a range from 450 degrees to 800 degrees Celsius.

During a second operational mode of the second in-line intermediate reaction compound generator 1000, the material of the at least one metal portion 1050 can be consumed to generate the intermediate reaction compound (such as titanium dichloride). The temperature of the at least one metal portion 1050 may be maintained at a temperature suitable for efficient generation of the intermediate reaction compound, which may be, for example, in a range from 300 degrees Celsius to 800 degrees Celsius, such as from 400 degrees to 770 degrees Celsius.

Generally, a deposition apparatus can include the second exemplary chemical vapor deposition tool 700 of FIG. 7. In this case, the deposition apparatus can include a deposition chamber 202 comprising a chuck 220 and a vacuum enclosure 203 connected to a vacuum pump system 299 and enclosing the chuck 220; and a gas manifold configured to provide process gases to the vacuum enclosure 203. The process gases include a metal precursor gas. The gas manifold comprises an in-line intermediate reaction compound generator (800 or 1000) including an inlet orifice (812 or 1012) into which the metal precursor gas is supplied and an exhaust orifice (814 or 1014) from which an intermediate reaction compound derived from the metal precursor gas exits into a gas inlet of the vacuum enclosure 203. The in-line intermediate reaction compound generator (800 or 1000) comprises at least one metal portion {(851, 852) or 1050} connected to a heater {(820, 830, 880) or 1030} configured to maintain the at least one metal portion {(851, 852) or 1050} at a temperature greater than 300 degrees Celsius, such as greater than 400 degrees Celsius, during operation.

In one embodiment, the at least one metal portion {(851, 852) or 1050} consists essentially of a same elemental metal as an elemental metal within the metal precursor gas. In one embodiment, the metal precursor gas comprises molecules of a compound (such as titanium tetrachloride) of the elemental metal (such as titanium) and multiple non-metallic atoms (such as chlorine atoms), and deposition of a material of the elemental metal from the metal precursor gas comprises multiple decomposition processes in which the compound of the elemental metal and multiple non-metallic atoms decomposes into an intermediate reaction compound (such as titanium dichloride) including the elemental metal and a lesser number of non-metallic atoms and the intermediate reaction compound subsequently decomposes into the material of the elemental metal. In one embodiment, the elemental metal is titanium. In one embodiment, the metal precursor gas is titanium tetrachloride.

In one embodiment, the in-line intermediate reaction compound generator (800 or 1000) is configured to generate the intermediate reaction compound by partial decomposition of the metal precursor gas, and the deposition chamber 202 is a thermal chemical vapor deposition chamber configured to thermally decompose the intermediate reaction compound into the elemental metal.

In one embodiment, the deposition chamber 202 comprises a deposition chamber heater 240a, 240b, 240c located in (e.g., 240a), near or on the chuck 220 and configured to heat the chuck 220 to an elevated temperature. In one embodiment, the elevated temperature can be a temperature selected from a range from 300 degrees Celsius to 800 degrees Celsius, such as from 400 degrees Celsius to 750 degrees Celsius. In one embodiment, the in-line intermediate reaction compound generator (800 or 1000) may be configured to maintain the at least one metal portion at a temperature in a range from 300 degrees Celsius to 800 degrees Celsius, such as from 450 degrees Celsius to 750 degrees Celsius.

In one embodiment, the deposition chamber 202 comprises a showerhead 290 into which the process gases are flown and out of which the process gases are distributed over the chuck 220.

In one embodiment, the at least one metal portion {(851, 852) or 1050} comprises a surface that generally extends along a direction connecting the inlet orifice (812 or 1012) and the exhaust orifice (814 or 1014) and is parallel to a direction of flow of the metal precursor gas, and the in-line intermediate reaction compound generator (800 or 1000) comprises a heater {(820, 830, 880) or 1030} configured to heat the at least one metal portion {(851, 852) or 1050}.

In one embodiment, the gas manifold is configured to provide at least one gas selected from a carrier gas, a nitridation agent, an oxidation agent, a reducing agent, and an etchant gas into the deposition chamber 202. In one embodiment, the gas manifold can be configure to simultaneously flow $TiCl_4$ as the metal precursor gas, argon as the carrier gas, and hydrogen as the reducing agent through the in-line intermediate reaction compound generator (800 or 1000).

In one embodiment, a switchable vent valve 704 can be located between the exhaust orifice 814 or 1014) of the in-line intermediate reaction compound generator (800 or 1000) and the gas inlet (such as the showerhead 290) of the vacuum enclosure 203. The switchable vent valve 704 can be configured to select a flow path for the process gases that is selected from a first flow path from the switchable vent valve into the deposition chamber 202, and a second flow path from the switchable vent valve into a vent line 706 that is connected to the vacuum pump system 299. A valve controller 704 can be provided, which is configured to control the switchable vent valve 704 to select the first flow path during a deposition step in which a metal derived from the metal precursor gas is deposited on a substrate 250 located on the chuck 220 (for example, during a second operational mode of the in-line intermediate reaction compound generator (800 or 1000)), and to select the second flow path during at least one processing step other than the deposition step (for example, during a first operational mode of the in-line intermediate reaction compound generator (800 or 1000)).

A metal derived from the metal precursor gas can be deposited in the in-line intermediate reaction compound generator (800 or 1000) by simultaneously flowing the process gases through the in-line intermediate reaction compound generator (800 or 1000) and into the vent line 706 prior to loading a substrate into the deposition chamber 202 (for example, during the first operational mode). The metal derived from the metal precursor gas can be deposited on a substrate 250 in the deposition chamber 202 by simultaneously flowing the process gases through the in-line intermediate reaction compound generator (800 and 1000) and into the deposition chamber 202 after loading the substrate 250 into the deposition chamber 202.

The various apparatuses and methods of various embodiments can be used to provide a thermal chemical vapor deposition process in which the deposition rate is accelerated by enhanced supply of intermediate reaction compounds. The enhanced supply of the intermediate reaction compounds is provided by thermal decomposition of a metal precursor gas either inside the metallic material deposition chamber 202 or in an in-line intermediate reaction compound generator (800 or 1000)) provided within a gas manifold connected to the metallic material deposition chamber 202. A metal coating 230 may be provided within the metallic material deposition chamber 202 or a metal portion {(851, 852) or 1050} may be supplied within the in-line intermediate reaction compound generator (800 or 1000)) to function as a source of an elemental metal that is converted into a significant fraction of the intermediate reaction compound molecules provided to the metallic material deposition chamber 202. The metal coating 230 or a metal portion {(851, 852) or 1050} can be replenished by depositing the elemental metal on a chuck 220, or by depositing the elemental metal on the metal portion {(851, 852) or 1050} of an in-line intermediate reaction compound generator (800 or 1000), thereby enabling a semi-permanent operation of the apparatus of various embodiments. Optionally, a nitridation process can be performed on the deposited metal layer on the substrate.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A method of forming a metallic material on a substrate, comprising:
    coating a chuck of a metallic material deposition chamber with a metal coating consisting essentially of an elemental metal;
    loading a substrate onto the chuck of the metallic material deposition chamber;
    depositing a metal layer consisting essentially of the elemental metal on the substrate by thermal decomposition of a metal precursor gas including metal compound molecules,
    wherein:
        each of the metal compound molecules comprises an atom of the elemental metal and a first number of atoms of a non-metallic element;
        the metal compound molecules react with atoms of the elemental metal in the metal coating to generate molecules of an intermediate reaction compound including an atom of the elemental metal and a second number of atoms of the non-metallic element, the second number of atoms being less than the first number of atoms; and
        the metal layer on the substrate is formed by thermal decomposition of the intermediate reaction compound.

2. The method of claim 1, wherein the elemental metal is a transition metal.

3. The method of claim 2, wherein the non-metallic element comprises a halogen element.

4. The method of claim 3, wherein the metal compound molecules comprise molecules of a transition metal tetrachloride.

5. The method of claim 4, wherein:
    the transition metal tetrachloride comprises titanium tetrachloride; and
    the intermediate reaction compound comprises titanium dichloride.

6. The method of claim 1, wherein deposition of the metal layer on the substrate by the thermal decomposition of the metal precursor gas is performed without formation of a plasma generated by application of radio frequency power.

7. The method of claim 6, wherein the chuck is heated to an elevated temperature greater than 400 degrees Celsius during deposition of the metal layer on the substrate.

8. The method of claim 7, wherein:
the elevated temperature is in a range from 400 degrees to 650 degrees; and
the substrate is at a temperature that is the same as, or less than, the elevated temperature during deposition of the metal layer.

9. The method of claim 6, wherein:
the substrate comprises at least one via cavity having an undercut region; and
the coating of the elemental metal is formed conformally within the undercut region.

10. The method of claim 6, wherein the metal coating on the chuck is formed by a plasma-enhanced chemical vapor deposition (PECVD) process in which decomposition of the metal precursor gas is assisted by a plasma generated by application of external radio frequency power into the metallic material deposition chamber.

11. The method of claim 1, wherein the metal coating has a thickness within a range from 50 percent of a thickness of the metal layer to 500 percent of the thickness of the metal layer.

12. The method of claim 1, wherein:
the substrate is suspended over the chuck during deposition of the metal layer such that a gap of a substantially uniform height is present between the substrate and the chuck during deposition of the metal layer; and
a surface of the metal coating on the chuck underneath the gap provides a metal surface at which the intermediate reaction compound is generated.

13. The method of claim 12, wherein:
the metal layer is deposited on a backside of the substrate that faces the gap and on a front side of the substrate that is located on an opposite side of the backside; and
the metal layer is deposited at a higher deposition rate on the backside of the substrate than on the front side of the substrate.

14. The method of claim 1, wherein the intermediate reaction compound is formed at least partly by formation a compound of an atom of the elemental metal that is detached from the metal coating through reaction with a molecule of the metal precursor gas.

15. The method of claim 14, wherein the intermediate reaction compound is formed partly by dissociation of at least one atom of the non-metallic element from a molecule of the metal precursor gas upon reaction with the elemental metal within the metal coating.

16. The method of claim 15, wherein:
the elemental metal is titanium;
the metal precursor gas comprises titanium tetrachloride; and
the intermediate reaction compound comprises titanium dichloride that is formed partly by reaction of titanium atoms in the metal coating with molecules of titanium tetrachloride and partly by dissociation of chlorine from molecules of titanium tetrachloride.

17. The method of claim 1, further comprising performing a thermal nitridation process on the metal layer to convert at least a surface portion of the metal layer into a metal nitride layer.

18. The method of claim 17, further comprising performing a post-processing chamber conditioning process after removing the substrate from the metallic material deposition chamber by performing a plasma-assisted nitridation process in the metallic material deposition chamber.

19. The method of claim 18, further comprising performing a chamber pre-coating process prior to coating the chuck with the metal coating.

20. The method of claim 19, wherein the chamber pre-coating process deposits a metal precoat layer using a plasma-assisted metal deposition process and converts the metal precoat layer into a metal nitride precoat layer by a plasma-assisted nitridation process.

* * * * *